United States Patent [19]

Jackson

[11] 4,363,025

[45] Dec. 7, 1982

[54] SIGNAL GENERATING ARRANGEMENTS

[75] Inventor: Howard Jackson, Maidstone, England

[73] Assignee: Elliott Brothers (London) Limited, Chelmsford, England

[21] Appl. No.: 247,271

[22] Filed: Mar. 25, 1981

[30] Foreign Application Priority Data

Apr. 2, 1980 [GB] United Kingdom ............... 8011069

[51] Int. Cl.$^3$ ........................................... H03K 13/02
[52] U.S. Cl. ........................... 340/347 DA; 315/367; 328/181; 364/521; 340/739
[58] Field of Search ............................ 315/364, 367; 340/347 CC, 739, 701, 703, 736; 328/181; 364/521, 607; 307/228

[56] References Cited

U.S. PATENT DOCUMENTS

| | | | |
|---|---|---|---|
| 3,070,786 | 12/1962 | MacIntyre | 340/347 CC |
| 3,539,860 | 11/1970 | Max | 315/367 |
| 4,001,806 | 1/1977 | Sweeting | 340/739 |
| 4,176,398 | 11/1979 | Rider | 328/181 |

OTHER PUBLICATIONS

Brandon, "IBM Technical Disclosure Bulletin" vol. 20, No. 10, Mar. 1978, pp. 4155-4156.

Primary Examiner—C. D. Miller
Attorney, Agent, or Firm—Kirschstein, Kirschstein, Ottinger & Cobrin

[57] ABSTRACT

A digitally controlled, presettable, ramp signal generating arrangement comprising digital to analogue converter means (DA) and integrator means (A1, A2) having a first mode in which its output (0) assumes a value representative of the output of the converter means, and a second mode in which its output changes at a rate dependent on the output of the converter means. The arrangement finds especial application in symbol display arrangements.

5 Claims, 4 Drawing Figures

SIGNAL GENERATING ARRANGEMENTS

This invention relates to digitally controlled presettable analogue ramp signal generating arrangements.

A known form of such an arrangement comprises an up-down counter whose output is fed to a digital to analogue converter whose output is periodically sampled. The arrangement is pre-set by loading an appropriate number into the counter, the converter then producing a corresponding analogue output. The counter is then driven by clock pulses to change the converter analogue output at a desired rate determined by the frequency of the clock pulses. Sampling of the converter output is required to remove clocking glitches, but sampling gives rise to quantising of the output. Also the maximum rate of change of the output is limited by the maximum allowable clocking rate of the counter and the sampling circuit.

It is an object of the present invention to provide a digitally controlled presettable analogue ramp signal generating arrangement wherein the above mentioned problems are overcome.

According to the present invention a digitally controlled presettable analogue ramp signal generating arrangment comprises: digital to analogue converting means; and integrator means having a first mode in which its output assumes a value representative of an output of the converter means, and a second mode in which its output changes at a rate dependent on an output of the converter means.

Preferably the arrangement further includes analogue sample and hold means arranged to periodically sample and hold the output of the arrangement and control the output of the converting means so as to reduce towards zero any deviation in the output of the arrangement from its desired value at the time of sampling.

An arrangement in accordance with the invention may also include at least one storage means arranged to store an output produced by the arrangement when operating in its first mode, and comparator means connectable with said storage means and the output of the arrangement so as to compare the stored value of the arrangement output and the actual output of the arrangement during operation of the arrangement in its second mode.

Two arrangements in accordance with the invention will now be described, by way of example, with reference to the accompanying drawings in which.

The two arrangements are intended for use in controlling the X or Y deflection circuit of a cathode ray tube (CRT) of a symbol display arrangement in response to a digital control signal. It will be appreciated that in such an application, two arrangements in accordance with the invention will normally be used, one for X deflection, and the other for Y deflection.

Figure 1:
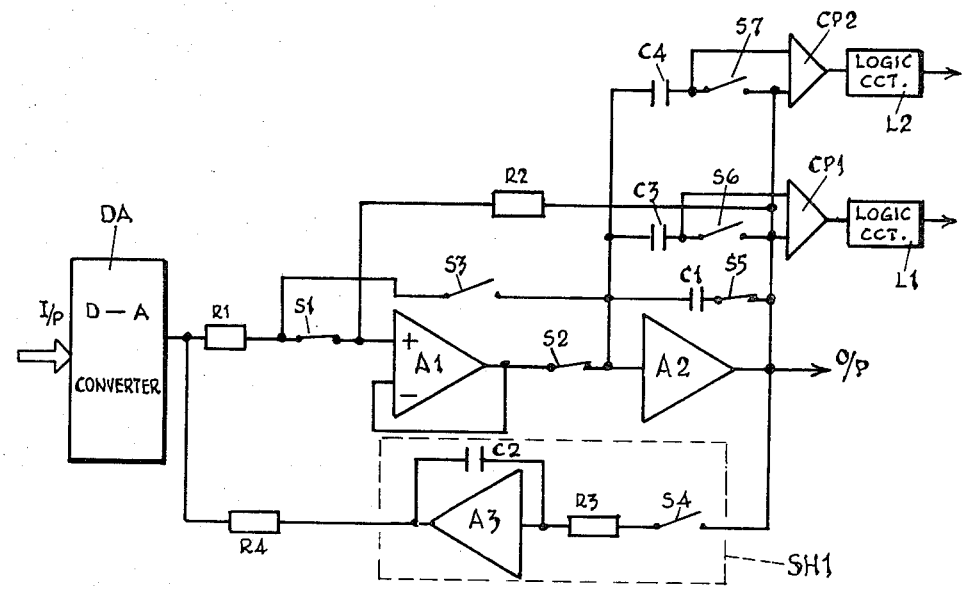
FIG. 1 is a schematic diagram of the first arrangement.

Referring to FIG. 1, the first arrangement comprises a digital to analogue converter DA whose analogue output is connected via a resistor R1 and a switch S1 to a first input of an operational amplifier A1 incorporated in a first stage of the arrangement. The output of the amplifier A1 is connected to the second input of the amplifier A1 and via a switch S2 to the input of a second amplifier A2 incorporated in a second stage of the arrangement whose output constitutes the output O/P of the arrangement.

The output of the amplifier A2 is connected via a resistor R2 to the first input of the amplifier A1 and a capacitor C1 is connected between the input and the output of the amplifier A2 via a switch S5. The input of the amplifier A2 is connected to the junction between resistor R1 and switch S1 via a switch S3.

The output of the amplifier A2 is also connected via a switch S4 and a resistor R3 to the input of a third amplifier A3. A capacitor C2 is connected between the output and the input of the amplifier A3 and the output of the amplifier is connected via a resistor R4 with the output of the converter DA.

Further capacitors C3 and C4 are connected via respective switches S6 and S7 between the input and the output of the amplifier A2. Each capacitor C3 and C4 is associated with a respective comparator CP1 or CP2 each having one input connected to the output of the amplifier A2 and its other input connected to the junction between the associated capacitor C3 or C4 and switch S6 or S7.

The output of each comparator is fed to a respective logic circuit L1 or L2.

It will be appreciated that the switches S1 to S7 are electronic switches, their operation being controlled by suitable control means (not shown) as hereinafter described.

The arrangement is operable in first and second modes. In the first mode a digital input I/P corresponding to a required pre-set initial output of the arrangement is applied to the converter DA with the switches S1, S2 and S5 closed and all other switches open. The amplifier A1 operates as a scaling amplifier causing the amplifier A2 to rapidly charge the capacitor C1, and hence causing the output O/P to rise, rapidly, at a rate determined by resistor R2, to a value determined by the digital input.

To change over to operation in the second mode the switch S3 is closed and the switches S1 and S2 opened, and a digital input corresponding to a required rate of change of the output is applied to the converter DA. The arrangement then operates as an integrator with the charge on the capacitor C1, and hence the output O/P, changing substantially linearly at a rate determined by the digital input of the converter DA.

It will be appreciated that in the envisaged application for the arrangement the first mode is used to set CRT spot position, and the second mode is used to scan the spot across the CRT screen.

The amplifier A3 and its associated components form a sample and hold circuit SH1 which is utilised to effect compensation for poor stability, e.g. temperature stability, of the components of the arrangement, in particular the capacitor C1. Periodically during operation, when the output O/P of the arrangement is not being used by the CRT deflection circuits, the converter DA is controlled to develop during operation in the second mode an output of nominal value zero at the output O/P of the arrangement at a particular time. At this time the switch S4 is closed and the actual output of the arrangement is acquired by the sampling circuit and applied as an offset at the output of the converter DA to reduce the output O/P more nearly to zero. The sampling period is typically 20 μs and the interval between sampling periods 20 ms. After a few such sampling periods, any offset in the output O/P is, for all practical purposes, reduced to zero even in the event of substantial variation of the circuit component values from their nominal values.

Each of the capacitors C3 and C4 forms a storages means for storing an analogue signal corresponding to the output of the arrangement when operated in its first mode, storage being effected by closing the associated switch S6 or S7 and opening the switch S5.

During operation in the second mode the relevant switch S6 or S7 is opened and the output of the associated comparator CP1 or CP2 indicates to the associated logic circuit L1 or L2 whether the output O/P is above or below the pre-set value of the output stored on the associated capacitor C3 or C4.

Figure 4:
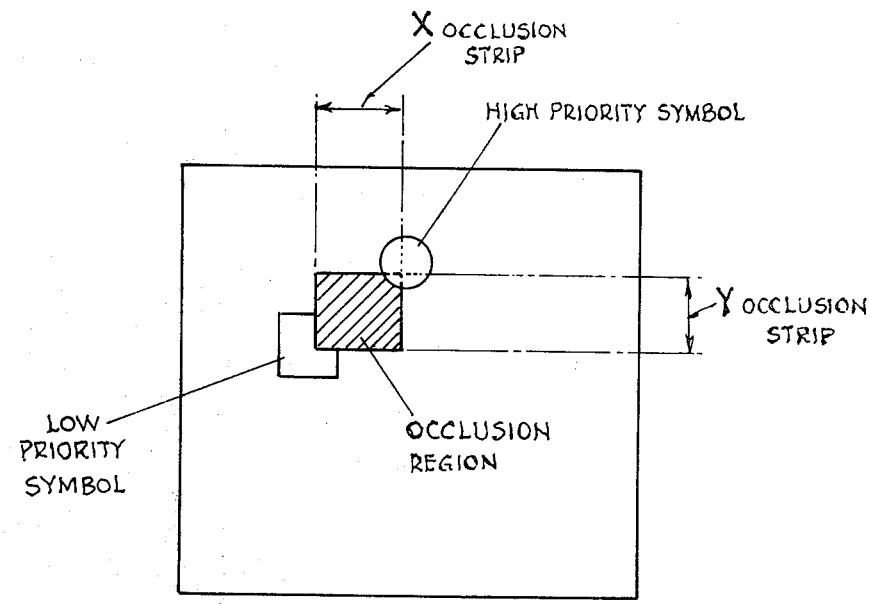
FIG. 4 is a diagram illustrating a further feature of the operation of the two arrangements.

This facility finds application in controlling the CRT bright up circuitry (not shown) so as to blank the display in a pre-defined area. By such means low priority display symbols may be prevented from introducing into areas reserved for high priority display symbols, FIG. 4 illustrating the effect produced. Thus, where the arrangement of FIG. 1 is being used to control X direction deflection of the CRT beam, the capacitors C3 and C4 may store values respectively defining the ends of a desired X direction occlusion strip, these values being stored by operation of the arrangement in its first mode during a period between symbol drawing.

Figure 2:
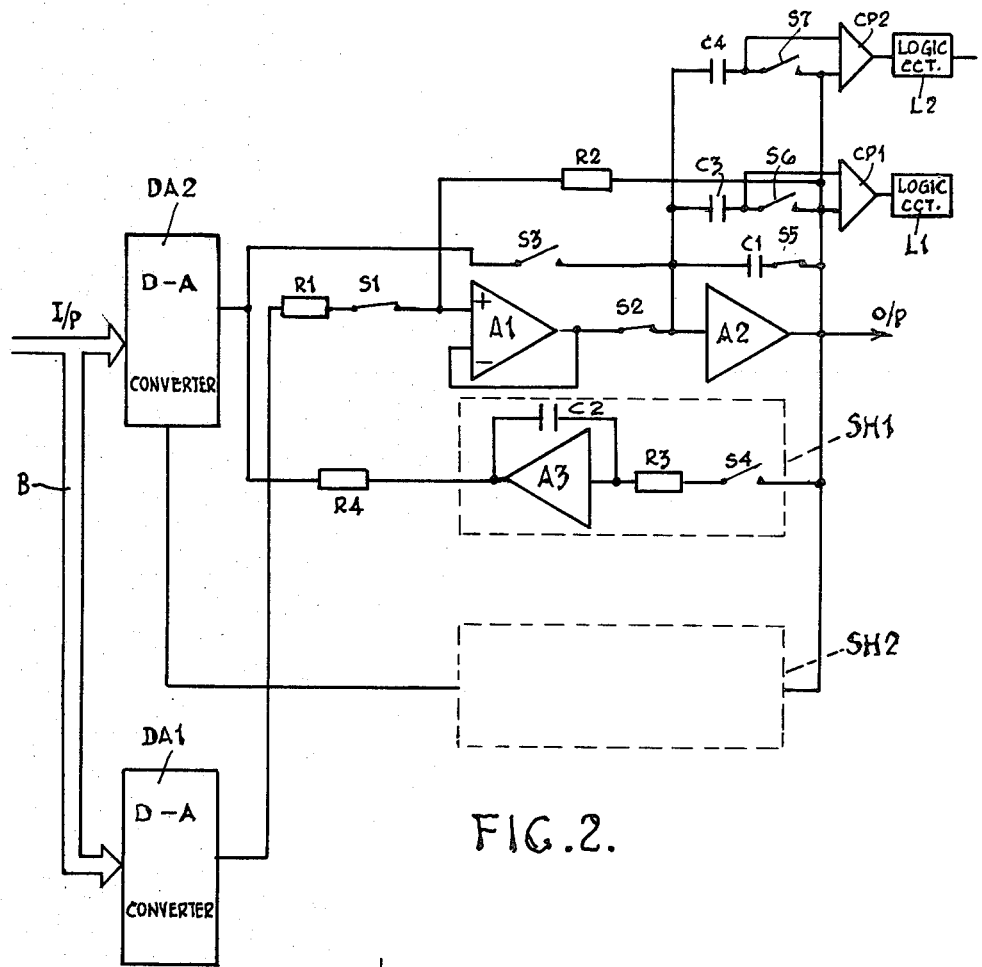
FIG. 2 is a schematic diagram of the second, more elaborate arrangement.

Referring now to FIG. 2, in a more developed arrangement in accordance with the invention separate digital to analogue converters DA1 and DA2 are provided for controlling the arrangement when operating in its first and second modes respectively. Thus the analogue output of converter DA1 is applied to the first input of amplifier A1 via switch S1 and the output of converter DA2 is applied to the input of amplifier A2 via switch S3.

The two converters DA1 and DA2 are supplied with separate digital inputs via a common input bus B.

In addition a second sample and hold circuit SH2 for compensation purposes is provided, the output of which is applied to the converter DA2 to control its gain.

Otherwise the arrangement of FIG. 2 is the same as that of FIG. 1, and corresponding components are designated by the same references.

In the arrangement of FIG. 2 compensation is effected by sample and hold circuits SH1 and SH2 as follows.

Figure 3:
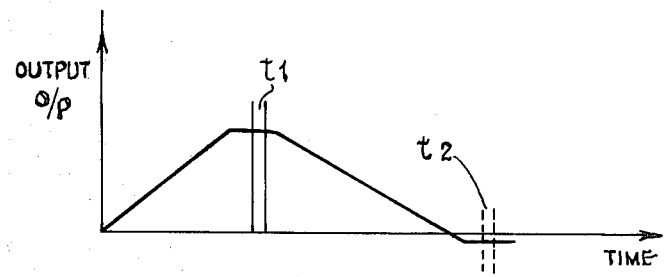
FIG. 3 is a representation of a waveform illustrating a feature of the operation of the arrangement of FIG. 2.

The digital inputs to the converters DA1 and DA2 are controlled to produce an output O/P of the arrangement of the form indicated in FIG. 3. During the initial steady portion of this output the circuit SH2 samples the output O/P during a time t1 and controls the gain input of the converter DA2 so as to reduce to zero any difference between the actual and desired values of the output O/P, the latter being applied to the circuit SH2 from a reference source (not shown). During a later time t2, when the output should have a zero value, the circuit SH1 samples the output O/P and controls the output of converter DA2 as described above in relation to FIG. 1.

It will be appreciated that in an arrangement in accordance with the invention the output is a truly analogue signal and is not quantised. Furthermore, the maximum possible rate of change is potentially fast compared with prior art arrangements using a clocked counter, the maximum rate of change of output being limited only by the current capability of the integrator means.

I claim:

1. A digitally controlled presettable analogue ramp signal generating arrangement comprising:
   (A) digital to analogue converting means;
   (B) integrator means consisting of
      (i) a first stage which operates as an amplifier,
      (ii) a second stage which operates as an integrator, and
      (iii) switching means which,
         (a) when the arrangement is in a first mode, interconnects said converter and said first and second stages so that the output of the converter means is applied to said second stage via said first stage, the first stage operates as a scaling amplifier and the output of the integrator means assumes a value representative of the output of the converter means, and
         (b) when the arrangement is in a second mode, interconnects said converter means and said second stage and disconnects said first stage so that the output of the converter means is applied directly to said second stage and the output of the integrator means changes at a rate dependent on the output of the converter means; and
   (C) analogue sample and hold means which periodically samples and holds the output of the arrangement and controls the output of the converting means to reduce towards zero any deviation in the output of the arrangement from its desired value at the time of sampling.

2. An arrangement according to claim 1 wherein said converter means comprises first and second digital to analogue converters whose outputs are utilised respectively when the arrangement is operating in its first and second modes respectively.

3. An arrangement according to claim 1 wherein the sample and hold means comprises first and second sample and hold circuits, the first being arranged to reduce towards zero any deviation in the output of the arrangement from a desired finite value, and the second being arranged to reduce towards zero any deviation in the output of the arrangement from a desired zero value.

4. An arrangement according to claim 1 including at least one storage means operable to store an output produced by the arrangement when operating in its first mode, and comparator means connectable with said storage means and the output of the arrangement to compare the stored value of the arrangement output and the actual output of the arrangement during operation of the arrangement in its second mode.

5. An arrangement according to claim 4 wherein said storage means comprises a capacitor.

* * * * *